US005563500A

United States Patent [19]

Muterspaugh

[11] Patent Number: 5,563,500

[45] Date of Patent: Oct. 8, 1996

[54] VOLTAGE REGULATOR HAVING COMPLEMENTARY TYPE TRANSISTOR

[75] Inventor: Max W. Muterspaugh, Indianapolis, Ind.

[73] Assignee: Thomson Consumer Electronics, Inc., Indianapolis, Ind.

[21] Appl. No.: 241,121

[22] Filed: May 16, 1994

[51] Int. Cl.[6] ................................ G05F 1/40; G05F 1/44

[52] U.S. Cl. ................................ 323/282; 323/273

[58] Field of Search ................................ 323/223, 226, 323/265, 266, 273, 280, 282, 284, 289, 351

[56] References Cited

U.S. PATENT DOCUMENTS

| | | | |
|---|---|---|---|
| 2,832,035 | 4/1958 | Bruck et al. | 323/22 |
| 3,109,979 | 11/1963 | Faulkner et al. | 323/22 |
| 3,445,751 | 5/1969 | Easter | 323/282 |
| 4,684,877 | 8/1987 | Shreve et al. | 323/273 |
| 4,988,942 | 1/1991 | Ekstrand | 323/282 |
| 5,220,272 | 6/1993 | Nelson | 323/282 |
| 5,274,323 | 12/1993 | Dobkin et al. | 323/273 |
| 5,373,225 | 12/1994 | Poletto et al. | 323/282 |
| 5,389,871 | 2/1995 | Otake | 323/282 |
| 5,399,958 | 3/1995 | Iyoda | 323/282 |
| 5,408,404 | 4/1995 | Mitchell | 323/282 |
| 5,422,562 | 6/1995 | Mammano et al. | 323/282 |

OTHER PUBLICATIONS

Power Supply Overload Protection Techniques, F. C. Easter RCA Engineer, Sep. 29, 1969.

Voltage Regulator Handbook, Feedback Current Limiting, National Semiconductor Corporation, Sanata Clara, CA pp. 7–10 to 7–19.

Linear Applications, vol. 1, AN–21 to AN21–9, Designs for Negative Voltage Regulators.

National Semiconductor, LM104/LM204/LM304 Negative Regulator pp. 1–28 to 1–31.

*Primary Examiner*—Matthew V. Nguyen

*Attorney, Agent, or Firm*—Joseph S. Tripoli; Peter M. Emanuel; Frederick A. Wein

[57] ABSTRACT

The present invention concerns a voltage regulator wherein the series pass transistor and an amplification transistor are of complementary types. Supply current flows from the DC supply source through the emitter-collector path of the series pass transistor to the load. The amount of this current is controlled by a negative feedback control signal coupled from the regulated output voltage to the base electrode of the amplification transistor, which in turn drives the base of the series pass transistor. The emitter electrode of the amplification transistor is coupled to a voltage which is less than the regulated DC output voltage so that drive requirements for the pair of transistors is reduced.

10 Claims, 2 Drawing Sheets

VOLTAGE REGULATOR HAVING COMPLEMENTARY TYPE TRANSISTOR

BACKGROUND

The present invention concerns voltage regulators, and more particularly, a voltage regulator wherein the efficiency of the regulator is improved.

The present voltage regulator is useful in a direct broadcast satellite receiver system which includes an outdoor microwave antenna which can be aimed at a satellite to receive a signal from the satellite. The signal received from the satellite is amplified by a "low noise block converter" (LNB) mounted in very close proximity to or on the antenna.

The output signal from the LNB is carried to an indoor receiver by a coaxial cable. In order to supply power from the indoor receiver to the LNB, as well as to control the polarization of the LNB, a DC voltage is multiplexed onto the center conductor of the coaxial cable. The circuits in the LNB are designed so that they will function with either a lower power supply voltage or a higher power supply voltage, with the dual supply voltages being used to control polarization settings of the LNB, e.g., the lower voltage selecting right hand circular polarization (RHCP) and the higher voltage selecting left hand circular polarization (LHCP). The current drain of the LNB is fairly constant with either of the regulated power supply voltages.

Voltage regulators, which use a controllable series impedance device for maintaining a regulated output voltage coupled to ax load, are susceptible to damage if a short circuit or other fault is applied to the output terminals of the regulator. Such damage often is caused by excessive thermal dissipation of the series impedance device or by exceeding the current rating of the series device. For this reason, it is common to provide overload protection to prevent such damage to the regulator.

One type of overload protection is current limiting in what is known as a "foldback" voltage regulator, such as is disclosed in Easter U.S. Pat. No. 3,445,751. Such a regulator provides output voltage regulation for a changing load until an overload current threshold is reached. For load currents above this threshold, the available output current decreases as the load increases, with a corresponding decrease in the output voltage. The short-circuit current can be adjusted to be but a small fraction of the full load current, thus minimizing the dissipation in the series pass transistor. The voltage regulator of the present invention is such a "foldback" voltage regulator.

Supply current flows from the DC supply source through the emitter-collector path of the series pass transistor to the load. The amount of this current is controlled by a control signal coupled from the output voltage to the base electrode of series pass transistor via an amplification transistor and other circuitry arranged in a negative feedback circuit configuration. In this way, with the voltage drop across the emitter-collector path of the series pass transistor is adjusted to maintain a regulated output voltage.

The series pass transistor incurs a voltage drop under full load, and accordingly dissipates power as part of its regulating function. It is desirable to minimize this power dissipation in the series pass transistor to improve reliability of the series pass transistor, to reduce the cost of the series pass transistor along with associated heat sinks, and to improve the efficiency of the regulation at maximum output voltage by minimizing the voltage difference between the unregulated input voltage and the regulated output voltage.

SUMMARY OF THE INVENTION

Briefly, the present invention concerns a voltage regulator wherein the series pass transistor and an amplification transistor are of complementary types. Supply current flows from the DC supply source through the emitter-collector path of the series pass transistor to the load. The amount of this current is controlled by a negative feedback control signal coupled from the regulated output voltage to the base electrode of the amplification transistor, which in turn drives the base of the series pass transistor. The emitter electrode of the amplification transistor is coupled to a voltage which is less than the regulated DC output voltage so that drive requirements for the pair of transistors is reduced.

BRIEF DESCRIPTION OF THE DRAWING

Reference can be had to the drawings wherein.

DETAILED DESCRIPTION OF THE PREFERRED EMBODIMENT

Figure 1:
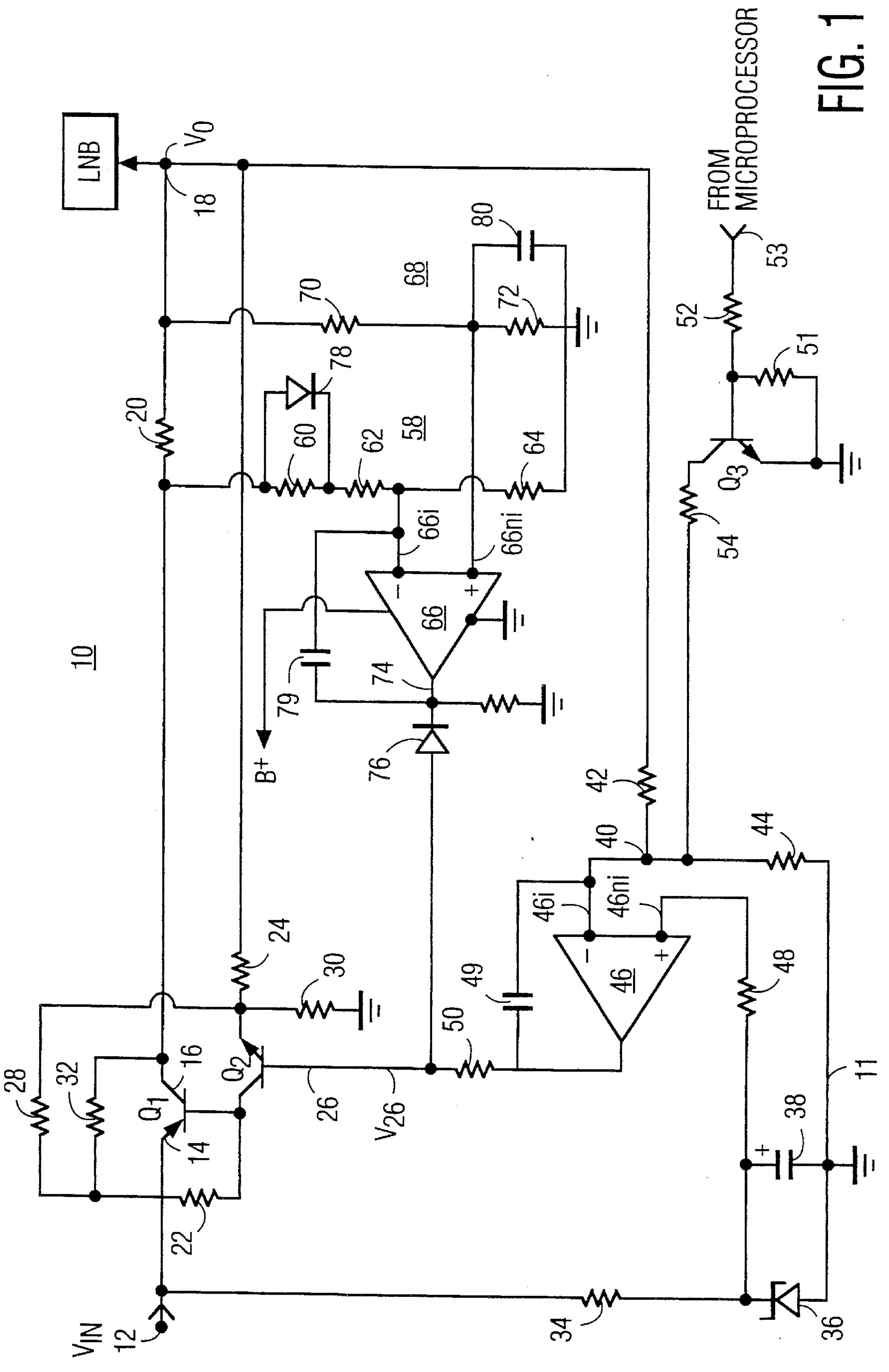
FIG. 1 shows a schematic of a regulator according to aspects of the present invention.

Referring now to FIG. 1, there is shown a voltage regulator 10 according to aspects of the present invention. Voltage regulator 10 can be switchable between a higher regulated DC output voltage mode and a lower regulated DC output voltage mode.

An unregulated direct current power supply source (not shown) is connected between terminal 12 and a reference potential point 11 (e.g., ground). The emitter electrode 14 of series pass PNP transistor Q1 is coupled to terminal 12. The collector electrode 16 of transistor Q1 is coupled to an output terminal 18 through resistor 20. A load (LNB) is coupled between output terminal 18 and reference point 11 (not shown). The base electrode of transistor Q1 is coupled to a collector electrode of NPN amplification transistor Q2 and to input terminal 12 through a resistor 22. The emitter electrode of transistor Q2 is coupled to output terminal 18 through a resistor 24 and to reference point 11 by resistor 30. The base electrode of transistor Q2 is coupled to receive a control signal, which will be discussed more fully below.

Supply current flows from the DC supply source coupled to terminal 12 through the emitter-collector path of transistor Q1 and resistor 20 to output terminal 18 and the load. The amount of this current is controlled by the control signal coupled to the base electrode of transistor Q2 via line 26, with the voltage drop across transistor Q1 being adjusted to maintain a regulated output voltage at terminal 18. A resistor 32, coupled between the emitter and collector electrodes of Q1, continues to provide some current to the load even if transistor Q1 is completely cut-off. Resistor 22, coupled between the emitter electrode and the base electrode of transistor Q1, reduces the effects of collector to base leakage currents in transistor Q1.

The complementary arrangement of transistors Q1, Q2 provides both voltage and current gain since the collector electrode of transistor Q2 is coupled to the base electrode of transistor Q1 and the output of the series pass arrangement is taken from the collector electrode 16 of transistor Q1. Thus, transistors Q1, Q2 are arranged as amplifiers within a feedback loop with the loop gain determined by a feedback network comprised of resistor 24 coupled from output terminal 18 to the emitter electrode of transistor Q2, and resistor 30 coupled to ground.

Figure 2:
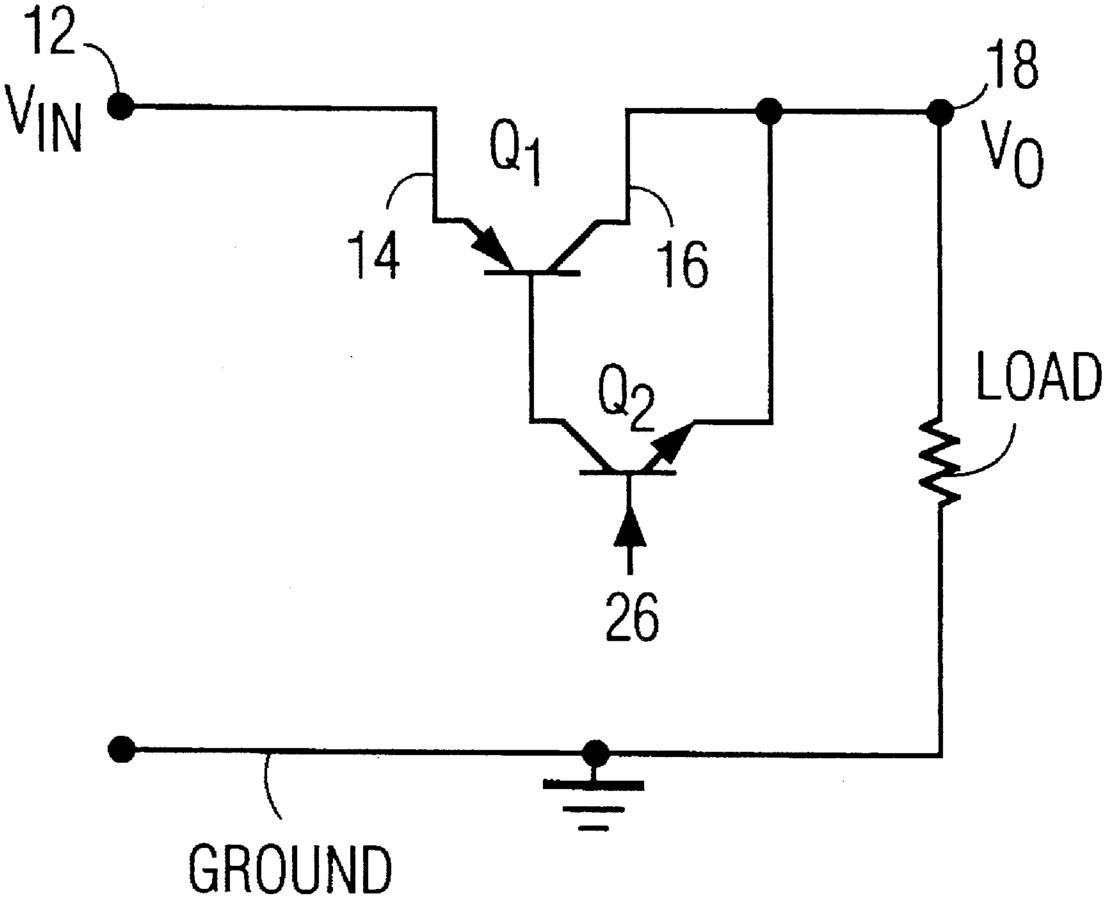
FIG. 2 shows an illustrative modification of a portion of the regulator of FIG. 1.

Additionally, the arrangement of transistors Q1, Q2 and resistors 24, 30 has a further advantage of improving the efficiency of regulator 10, by reducing power dissipation losses in Q1 under heavy load conditions, and reducing the drive requirements for transistors Q1, Q2. FIG. 2 shows a portion of the series pass arrangement without the resistor divider made up of resistors 24, 30 (resistor 24 is replaced by a short circuit and resistor 30 is replaced by an open circuit). In this arrangement, the voltage at the base of transistor Q2 (line 26), would be 0.7 volts above the voltage Vo at output terminal 18, and due to the base-emitter voltage drops in transistors Q1 and Q2, Vo would be at least 1.4 volts below the input voltage Vin at terminal 12. This provides an upper limit to the maximum regulated output voltage with respect to the unregulated input voltage. Further, the 1.4 volt voltage drop across transistor Q1 dissipates power in transistor Q1.

To have the regulator operate with a lower difference voltage between the input voltage Vin and the output voltage Vo, and reduce power dissipation in transistor Q1, it is desirable that transistor Q1 be driven into saturation at the highest output voltages in the high voltage mode. Voltage divider resistors 24, 30 improve the efficiency of the series pass circuit to achieve these attributes.

Referring back to FIG. 1, voltage V26, at line 26, is mathematically expressed as follows:

V26=Vbe of Q2+Vo(resistor 30/(resistor 30+resistor 24)).

If the Vbe of Q2 is 0.7 volts and the value of resistor 24 equals the value of resistor 30, then:

V26=0.7 volts+Vo/2.

Since this arrangement lowers the voltage at the emitter of transistor Q2 to substantially below the voltage Vo, it makes it easier to drive Q2 harder since the voltage V26 can be a lower voltage, thus allowing transistor Q1 to be more easily driven into saturation while still maintaining transistor Q2 in an active non-saturating state. Thus, with divider resistors 24, 30, the series pass transistor Q1 can be driven so that Vo=Vin−0.2 volts (the typical saturation voltage for transistor Q1) instead of at least 1.4 voltage, as discussed above. Thus, the regulator can operate with a lower difference between the input voltage Vin and the output voltage Vo, and with a resulting reduction in the power dissipation in transistor Q1 when it is fully driven.

The lower difference between input and output voltages is of particular importance in the higher output voltage mode because the maximum value of voltage Vin is limited. Additionally, since the control voltage applied to lead 26 is now considerably lower than B+, operational amplifier 46, which provides control signal V26, as will be discussed more fully below, is not required to operate at output voltages near the value of B+ in order to drive transistor Q2 to saturate transistor Q1.

A resistor 28 is coupled between the emitter electrode 14 of transistor Q1 and the emitter electrode of transistor Q2, to prevent the emitter electrode of Q2 from falling so low when the output is short circuited, that operational amplifier 46 cannot reverse bias the base-emitter junction of transistor Q2 to cut-off transistor Q1. The ability to cause transistor Q1 to be cut-off is important for current limiting, which will be discussed more fully below.

A reference voltage is provided by resistor 34 and zener diode 36 connected in series between input terminal 12 and ground, and the reference voltage is filtered by a capacitor 38. The reference voltage is coupled to a non-inverting (ni) input terminal 46*i* of an operational amplifier 46 where it is compared to a divided down version of Vo, which is coupled to an inverting (i) input terminal 46*i*. The divided down version of Vo is derived from a tap at the junction of series voltage divider resistors 42 and 44 coupled between output terminal 18 and ground 11. The output signal of amplifier 46 provides the control signal V26 at line 26 through isolation resistor 50. This arrangement provides negative feedback which reduces or increases the drive to transistor Q1 if there is a respective increase or decrease in the regulated output voltage Vo. Capacitor 49, coupled between the output of amplifier 46 and terminal 46*i*, suppresses oscillation.

Switching between lower and higher output voltage modes is made possible by transistor Q3, which can be driven into saturation by a control signal coupled to its base electrode from a control unit, (not shown), such as a microprocessor, through resistor divider 51, 52. The collector electrode of transistor Q3 is coupled to terminal 46*i* by resistor 54, and when transistor Q3 is driven into saturation, resistor 54 is coupled in parallel with divider resistor 44, thus modifying the voltage divider ratio of resistors 42, 44. The resulting change in V26, provided by comparator amplifier 46, causes the output voltage at terminal 18 to be switched to the higher voltage required for LHCP by the LNB.

Turning now to the foldback current limiting aspect of the present regulator, a voltage divider 58, comprising series resistors 60, 62 and 64, is coupled between collector 16 of transistor Q1 and ground, with a tap at the junction of resistors 62 and 64 being coupled to an inverting input terminal 66*i* of operational amplifier 66. A voltage divider 68, comprising series resistors 70 and 72, is coupled between output terminal 18 and ground, with a tap at the junction of the resistors 70, 72 being coupled to a non-inverting (ni) input terminal 66*ni* of amplifier 66. Output terminal 74 of amplifier 66 is coupled to the cathode of a diode 76, with the anode of diode 76 being coupled to control lead 26. Diode 76 prevents operational amplifier 66 from effecting V26 during normal operation, as will be discussed more fully below. Capacitor 79, coupled between output terminal 74 and terminal 66*i*, suppresses oscillation. Capacitor 80, coupled across resistor 72, prevents any AC signal received from the LNB load from effecting amplifier 66. The component values of the resistors in dividers 58, 68, are as follows:

| | |
|---|---|
| resistor 60 = 1K ohms | resistor 62 = 3K ohms |
| resistor 64 = 12K ohms | resistor 70 = 2.8K ohms |
| resistor 72 = 12K ohms | |

Resistor 20, (3.3 ohms), develops a voltage thereacross proportional to the output current. Thus, the voltages across dividers 58 and 68 are slightly different, and the voltages at the taps of the two dividers are arranged to be slightly different. When current drawn through resistor 20 is less than the threshold foldback current, the action of voltage dividers 58 and 68 is such that the voltage at terminal 66*ni* is more positive than the voltage at terminal 66*i*, and the output voltage at terminal 74 is at or near the B+ voltage. This back biases diode 76 and prevents the output of amplifier 66 from interfering with the drive at line 26 under normal operation. Thus, unless the circuit is in the current limiting mode, normal control of line 26 is provided by amplifier 46. However, if the current drawn through resistor 20 exceeds the foldback threshold current, the voltage drop across resistor 20 causes the voltage at the terminal 66*ni* to be slightly lower than the voltage at terminal 66*i*. This forces the output voltage at terminal 74 to go low due to the large gain of operational amplifier 66. This causes diode 76 to be forward biased and cause the operation of amplifier 46 to be overridden so that the control voltage on line 26 is reduced to nearly zero volts. As a result, the output current at terminal 18 is reduced to nearly zero and output voltage Vo is reduced to nearly zero volts. In this manner, when the output is short circuited or a fault occurs in the load, the output current is "folded back" from the nominal output current which is provided to the load during normal operation. For example, the output current may be folded back from a normal value of 350 milliamperes to about 10 milliamperes. Thus, transistor Q1 is protected from being subjected to excessive thermal dissipation or overcurrent condition due to a load fault. When the load fault is removed, voltage regulator 10 recovers and returns to normal operation.

Voltage regulator 10 is a dual voltage voltage regulator. When the output voltage Vo is changed to the higher voltage, the foldback threshold current at which current limiting is initiated, would also be changed. The change in the foldback threshold current occurs because the voltage drop across the current sensing resistor 20 would remain the same for any particular current, but the differential voltage coupled to input terminals 66*ni* and 66*i* due to the increase in voltage across voltage dividers 58, 68. This is not desirable since the protection afforded transistor Q1 and the load would be reduced.

In the present embodiment, to maintain the same current limiting threshold in the higher voltage mode, the voltage division of divider 58 is altered by diode 78 coupled across resistor 60. The voltage drop across resistor 60 is chosen to be less than the threshold of forward conduction of diode 78 in the lower output voltage mode. However, when regulator 10 is switched into the higher voltage mode, the higher voltage drop across resistor 60 is sufficient to cause diode 78 to conduct in its forward direction, thus changing the voltage division of divider 58 and the relationship of the difference voltage applied to terminals 66*i* and 66*i*. This change of voltage divider 58 maintains substantially the same foldback threshold current in the higher voltage output mode as in the lower voltage output mode. For example, without the change in voltage divider 58, the current limiting threshold at the lower regulated output voltage, in the exemplary embodiment, would be about 350 ma, and the current limiting threshold at the higher regulated output voltage would be about 600 ma. With the change in voltage divider 58, the current limiting threshold is about 350 ma for each of the dual output voltages.

In the present embodiment, diode 78 is a 1N914 diode having a reasonably sharp "knee". If it is desired to reduce the sharpness of the conduction knee, a resistor (not shown) can be connected immediately in series with diode 78. Alternately, diode 78 can be replaced by a plurality of series connected diodes. Other voltage sensitive devices can also be used, such as germanium diodes, LED's, voltage dependent resistors, or zener diodes. In the case of an LED, the diode itself may be a visual indicator as to the operating mode of the regulator. Additionally, a relay or a switching transistor can be used in place of diode 78. In such a case, the presence or absence of a microprocessor signal, such as available at terminal 53, can be used to initiate the switching of the divider resistors when that same microprocessor signal initiates the change in output voltage. Still further, the voltage sensitive device can be connected elsewhere in one of the voltage dividers.

It should be noted that in the exemplary embodiment, operational amplifiers 46 and 66 are LM348 operational amplifiers made by National Semiconductor of USA. These operational amplifiers have PNP input circuits which permit the amplifiers to still be operational when the voltages at the input terminals are very low. However, it has been found that operational amplifiers having NPN input circuits, typically are not operational when the voltages at the input terminals are lower than about one volt. It has been found that if such NPN input circuit operational amplifiers are used, the amplifier 66 may latch in the foldback current limiting mode, i.e., output terminal 74 is latched to zero output volts, and will not recover to a normal operating mode when the fault is removed from output terminal 18. However, there may be situations where this latching in a "fail-safe" mode may be desirable.

I claim:

1. A voltage regulator comprising:

an input terminal for receiving unregulated DC voltage;

an output terminal for providing a regulated DC voltage;

regulating means coupled between the input terminal and the output terminal and having a characteristic responsive to a control signal;

means for generating the control signal responsive to the comparison of a version of the regulated DC voltage with a reference voltage;

the regulating means comprising a first transistor of a first type and having a first electrode coupled to the output terminal, and a second transistor of a complementary type with respect to the first transistor and having a second electrode, the second transistor coupling an amplified version of the control signal to the first transistor, the first and second transistors amplifying the control signal in a cascade arrangement, and first and second resistances comprising a voltage divider coupled between the output terminal and a reference potential with the second electrode of the second transistor coupled to a junction of the first and second resistances, the first and second resistances being included within a feedback loop including the first and second transistors.

2. The voltage regulator of claim 1 wherein the voltage divider resistances reduce the voltage applied to the second electrode to a magnitude less than the regulated DC output voltage so that the control voltage necessary to drive the second transistor into saturation is less than the regulated DC output voltage.

3. The voltage regulator of claim 1 wherein a third resistance is coupled between an emitter electrode and a collector electrode of the first transistor for providing current to the load independent of the first transistor.

4. The voltage regulator of claim 1 wherein a fourth resistance is coupled between an emitter electrode and a base electrode of the first transistor for reducing the effect of collector electrode to base electrode leakage currents in the first transistor.

5. The voltage regulator of claim 1 wherein a fifth resistance is coupled between an emitter electrode of the first transistor and an emitter electrode of the second transistor to provide a voltage bias with respect to the reference potential for the emitter electrode of the second transistor.

6. The voltage regulator of claim 3 wherein a fourth resistance is coupled between the emitter electrode and a base electrode of the first transistor for reducing the effects of collector electrode to base electrode leakage currents in the first transistor.

7. The voltage regulator of claim 3 wherein a fifth resistance is coupled between the emitter electrode of the first transistor and an emitter electrode of the second transistor to provide a voltage bias with respect to the reference potential for the emitter electrode of the second transistor.

8. The voltage regulator of claim 4 wherein a fifth resistance is coupled between the emitter electrode of the first transistor and an emitter electrode of the second transistor to provide a voltage bias with respect to the reference potential of the emitter electrode of the second transistor.

9. The voltage regulator of claim 1 wherein a third resistance is coupled between an emitter electrode and a collector electrode of the first transistor for providing current to the load independent of the first transistor, a fourth resistance is coupled between the emitter electrode and a base electrode of the first transistor for reducing the effect of collector electrode to base electrode leakage currents in the first transistor, and a fifth resistance is coupled between the emitter electrode of the first transistor and an emitter electrode of the second transistor to provide a voltage bias with respect to the reference potential for the emitter electrode of the second transistor.

10. The voltage regulator of claim 1 wherein the feedback loop is a negative feedback loop.

* * * * *